United States Patent [19]

Janaswamy et al.

[11] Patent Number: 5,666,280
[45] Date of Patent: Sep. 9, 1997

[54] HIGH VOLTAGE INTEGRATED CIRCUIT DRIVER FOR HALF-BRIDGE CIRCUIT EMPLOYING A JFET TO EMULATE A BOOTSTRAP DIODE

[75] Inventors: Anand Janaswamy, Sunnyvale; Rajsekhar Jayaraman, Rancho Palos Verdes, both of Calif.; Michael Amato, Albuquerque, N. Mex.; Paul R. Veldman, Oss, Netherlands

[73] Assignee: Philips Electronics North America Corporation, New York, N.Y.

[21] Appl. No.: 579,654

[22] Filed: Dec. 27, 1995

Related U.S. Application Data

[63] Continuation-in-part of Ser. No. 275,569, Jul. 15, 1994, Pat. No. 5,502,632, which is a continuation-in-part of Ser. No. 155,053, Nov. 19, 1993, Pat. No. 5,373,435, which is a continuation of Ser. No. 160,176, May 7, 1993, abandoned.

[51] Int. Cl.$^6$ .................................. H02M 3/24; H02M 3/335
[52] U.S. Cl. ............................................. 363/98; 363/17
[58] Field of Search ................................ 363/16, 17, 56, 363/97, 98, 131, 132; 327/387, 390, 323, 494

[56] References Cited

U.S. PATENT DOCUMENTS

| | | | |
|---|---|---|---|
| 4,594,649 | 6/1986 | Rhoads et al. | 363/56 |
| 4,633,381 | 12/1986 | Upadhyay | 363/56 |
| 4,685,040 | 8/1987 | Steigerwald et al. | 363/17 |
| 4,740,717 | 4/1988 | Fletcher et al. | 307/443 |
| 4,796,145 | 1/1989 | Oshikiri | 361/57 |
| 4,908,551 | 3/1990 | Ludikhuize et al. | 315/209 |
| 4,989,127 | 1/1991 | Wegener | 363/16 |
| 5,365,118 | 11/1994 | Wilcox | 327/109 |
| 5,373,435 | 12/1994 | Jayaraman et al. | 363/98 |
| 5,408,150 | 4/1995 | Wilcox | 327/108 |
| 5,408,403 | 4/1995 | Nerone et al. | 363/98 |
| 5,410,466 | 4/1995 | Maehara | 363/98 |
| 5,519,306 | 5/1996 | Itoh et al. | 323/222 |

Primary Examiner—Matthew V. Nguyen
Attorney, Agent, or Firm—Jack D. Slobod

[57] ABSTRACT

A half-bridge driver circuit including a lower drive module and a floating upper drive module for driving respective external upper and lower power transistors of a high voltage half bridge is contained in an integrated circuit chip which includes an on-chip bootstrap diode emulator which is turned on in response to a control signal applied to its gate in order to pass current from a power supply to charge an external bootstrap capacitor that powers the upper drive module. The upper drive module is accommodated in an insulated well and the diode emulator includes as its main current carrying element, a JFET transistor formed along the periphery of the well. The JFET transistor is driven into a conducting state at the same time the lower power transistor is driven into a conducting state. The source electrode of the JFET is coupled to the power supply via a diode, such that the voltage at said source electrode cannot rise above a level which is one diode drop below the voltage at said power supply output and control circuitry derives the control control signal in a manner that it is constrained not to rise a level which is three diode drops below the voltage at the power supply output and limits the current that may flow in the gate electrode.

7 Claims, 2 Drawing Sheets

5,666,280

1

HIGH VOLTAGE INTEGRATED CIRCUIT DRIVER FOR HALF-BRIDGE CIRCUIT EMPLOYING A JFET TO EMULATE A BOOTSTRAP DIODE

RELATED APPLICATIONS

This application is a continuation-in-part of allowed application Ser. No. 08/275,569, filed Jul. 15, 1994, which issued on Mar. 26, 1996 as U.S. Pat. No. 5,502,632, which is a continuation-in-part of application Ser. No. 08/155,053, filed Nov. 19, 1993, which issued on Dec. 13, 1994 as U.S. Pat. No. 5,373,435, which is a continuation of application Ser. No. 08/160,176, filed May 7, 1993, and now abandoned. Allowed application Ser. No. 08/275,569 and U.S. Pat. No. 5,373,435 are incorporated herein by reference.

BACKGROUND OF THE INVENTION

1. Field of the Invention

The present invention relates to high voltage half-bridge circuits where one end of a load is driven from an output terminal at a junction between lower and upper alternately conducting power transistors that are connected in series across a high voltage DC supply. In its particular aspects, the present invention relates to circuitry for charging a bootstrap capacitor which provides to an upper drive circuit that controls the state of the upper transistor, a bootstrap power supply voltage floating on the voltage at the output terminal.

2. Description of the Related Art

Applications of high voltage half-bridge circuits include electronic ballasts for gas discharge lamps, switched mode power supplies, motor drives, and DC to AC converters.

A half-bridge driver circuit of the type mentioned, most of which is accommodated in a high voltage integrated circuit (HVIC), is known from U.S. Pat. No. 4,989,127, granted Jan. 29, 1991. This patent is assigned to the same assignee as the present application and is herein incorporated by reference. It discloses the general architecture of the driver circuit as including lower and upper drives for controlling the lower and upper power transistors, respectively. The upper drive comprises CMOS circuitry located in a floating well within the HVIC. Adequate breakdown voltage between this floating CMOS circuitry and the balance of the HVIC is achieved because the design of the well periphery is equivalent to that used to form Lateral Diffused Metal Oxide Semiconductor (LDMOS) transistors. The upper drive is powered by a bootstrap capacitor.

European Patent Application 0 318 110, which corresponds to U.S. Pat. No. 4,908,551, discloses a half-bridge circuit, where, as is now conventional, a bootstrap capacitor powering the upper drive is charged via a diode from a low voltage power supply voltage. The latter low voltage is formed across an off-chip high voltage diode.

In present high voltage integrated circuit half-bridge driver circuits of the type considered herein, both the bootstrap capacitor and the diode via which the bootstrap capacitor is charged are discrete components provided off-chip. This is because the presently needed capacitance value of the bootstrap capacitor, in excess of 50 nf, is too large to be feasibly produced on chip, and the breakdown voltage and peak current capacity needed in the bootstrap capacitor charging diode have also heretofore been thought to be beyond what may feasibly be accommodated with reasonable cost of space in the HVIC.

These discrete components are costly and not as reliable as they would be if incorporated in the HVIC.

SUMMARY OF THE INVENTION

It is an object of the present invention to provide a high voltage integrated circuit half-bridge driver circuit which includes on-chip circuitry emulating a diode of adequate breakdown voltage and current capacity via which the bootstrap capacitor is charged.

Briefly, the aforementioned and other objects of the present invention are satisfied by a driver circuit, comprised in a monolithic integrated circuit chip, for driving a half-bridge formed by lower and upper power transistors connected between an output terminal and respective lower and upper rails of a high voltage DC supply, and for charging a bootstrap capacitor, provided off-chip, which powers an on-chip upper drive module that controls the upper power transistor. The bootstrap capacitor has one end connected to the output terminal of the half-bridge. In accordance with the present invention, a bootstrap diode emulator means in the form of a JFET is provided on-chip for charging the bootstrap capacitor to a bootstrap voltage. The JFET is operated in a source follower configuration with its drain connected to the other end of the bootstrap capacitor and its source tied to one diode drop below Vdd. This diode drop assures that when the JFET is turned on its drain rises up to Vdd minus a diode drop hence charging the bootstrap capacitor. The source of the JFET is a diode drop below Vdd since when the device is turned on the source voltage is allowed to float between Vdd–Vdiode to Vzener+Vdd. The JFET is always operated in the third quadrant of its IV characteristics with the source voltage greater than the drain voltage and as a result the drain to source current $I_{DS}$ flows in the reverse direction from the source to the drain.

Preferably, the source and the drain of the JFET are n-type and the gate is p-type. Because of this, it necessary prevent the turn on of the parasitic diodes between gate source and gate drain. This is accomplished by making sure that the gate does not swing to Vdd, hence the gate is allowed to swing only to Vdd less three diode drops.

The JFET is a depletion mode device, so the device is on with a gate to source voltage $V_{GS}$ of zero. During normal operation, the device can be turned off when $V_{GS}$ is —(Vdd–Vdiode).

The upper drive module is accommodated in an insulated well formed in the monolithic integrated circuit Other objects, features and advantages of the present invention will become apparent upon perusal of the following detailed description when taken in conjunction with the appended drawing, wherein:

DETAILED DESCRIPTION OF THE PREFERRED EMBODIMENTS

Figure 1:
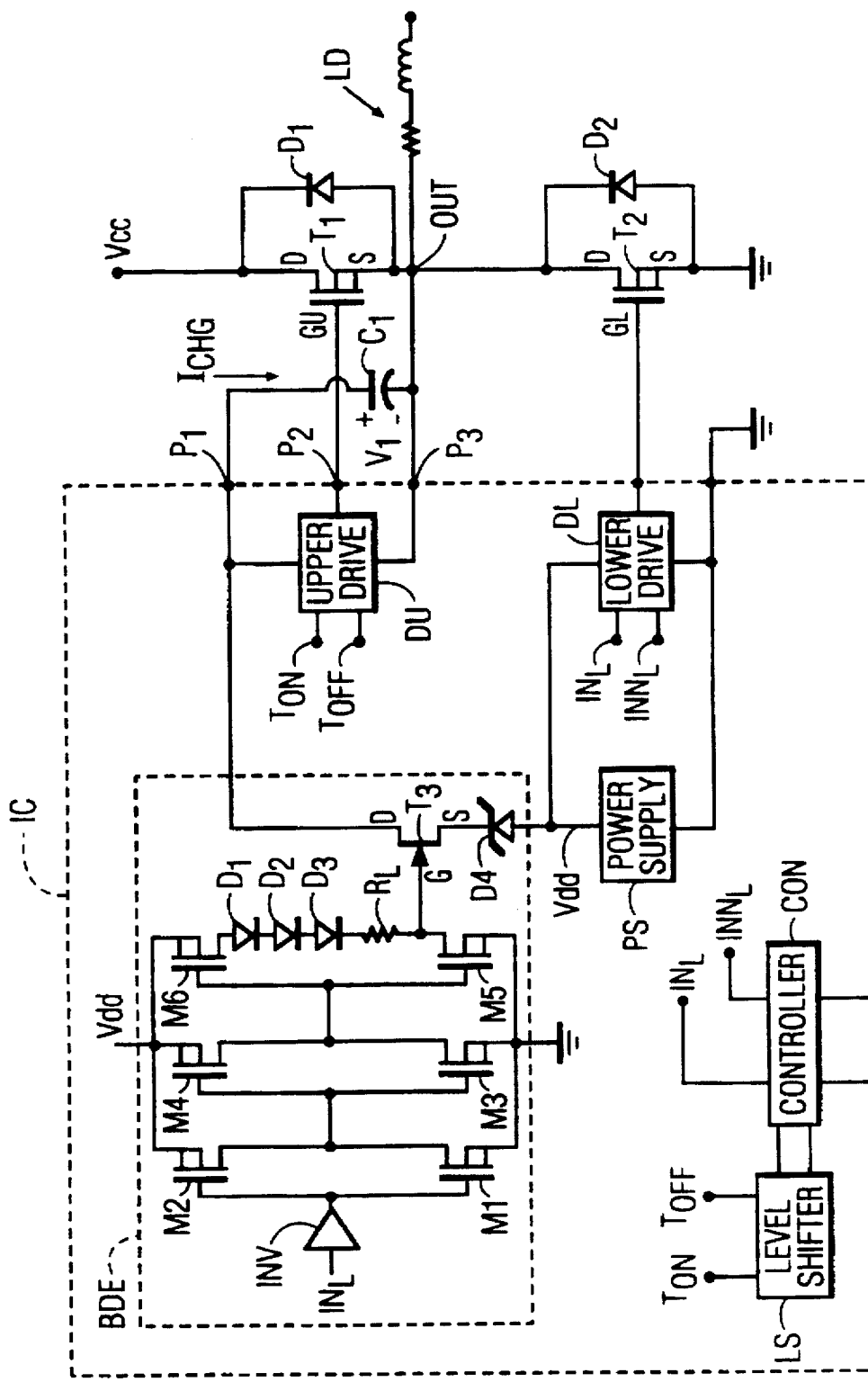
FIG. 1 is a schematic diagram of the driver circuit of the present invention in which components comprised in an integrated circuit chip are enclosed in a dashed box labelled IC.

Referring first to FIG. 1, there is shown a driver circuit in accordance with the present invention, contained in a monolithic high voltage integrated circuit IC, connected for driving an external half-bridge formed by power MOSFET's $T_1$ and $T_2$ connected in series across a high voltage (up to about 500 Volts) DC supply. The general circuit architecture of the half-bridge and driver is the same as shown and described in the aforementioned U.S. Pat. No. 4,989,127, with the exception of the provision of an on-chip bootstrap diode emulator BDE in accordance with the present invention.

In the half-bridge, power transistor $T_1$ is referred to as the upper transistor because its drain electrode is connected to the high side or upper rail of the DC supply, indicated in FIG. 1 as at the potential $V_{CC}$ and power transistor $T_2$ is referred to as the lower transistor because its source electrode is connected to the low side or lower rail of the DC supply, indicated in the figure as at the potential of power ground. The source electrode of upper transistor $T_1$ and the drain electrode of lower transistor $T_2$ are joined at the output terminal OUT of the half-bridge which is also connected to one end of a load LD. In power supply applications such as powering gas discharge lamps, the other end of the load may be maintained at a potential of half the supply voltage by being connected to the midpoint of a capacitive voltage divider (not shown) across the DC supply. As is well known, the transistors $T_1$ and $T_2$ are operated in a switch mode with respect to a high frequency (greater than 20 kHz) repetitive cycle, e.g. on the order of 100 KHz, where each is turned on (i.e. driven into a conducting state) during a different one of two time intervals or phases during a cycle, which are separated from each other by relatively small dead zone intervals on the order of about 500 ns. Switching transients at current turnoff due to load LD having in many applications a somewhat inductive impedance are limited by the inherent body diodes $D_1$ and $D_2$ of $T_1$ and $T_2$, respectively. $D_1$ is directed for limiting a positive voltage transient produced at output terminal OUT when the lower power transistor $T_2$ is turned off and diode $D_2$ is directed for limiting a negative voltage transient produced at the output terminal when the upper power transistor $T_1$ is turned off.

These cycles are established by a controller CON, which in response to an external input signal IN produces an essentially binary command signal $IN_L$ and its logical inverse $INN_L$ for controlling the conducting state of lower transistor $T_1$ and via level shifter LS produces pulse command signals $T_{ON}$ and $T_{OFF}$ for controlling the conducting state of the upper transistor $T_2$. Command signal $IN_L$ has one binary state only during the time interval or phase when lower transistor $T_1$ is to be driven into a conducting state. The command signals $T_{ON}$ and $T_{OFF}$ are provided in pulse form for noise and transient immunity purposes; $T_{ON}$ and $T_{OFF}$ indicate the instants when the upper transistor $T_2$ is to be turned on and off, respectively. The lower transistor command signals $IN_L$ and $INN_L$ are fed to a lower drive module DL which in response thereto drives the gate $G_L$ of lower transistor $T_2$ to turn on the lower transistor only during the phase defined by the lower transistor command signals. In a similar manner, command signals $T_{ON}$ and $T_{OFF}$ are fed to an upper drive module DU which in response thereto drives the gate $G_U$ of upper transistor $T_1$ to turn on the upper transistor during the phase defined by the upper transistor command signals. An R/S flip flop (not shown) within the upper drive module DU converts the command signals $T_{ON}$ and $T_{OFF}$ to binary form similar to $IN_L$ and $IN_{LL}$ in order that the balance of the upper drive module may be of the same design as the lower drive module DL.

Lower drive module DL is powered by a relatively low power supply voltage $V_{dd}$, e.g. 12 Volts, and upper drive module is powered by the voltage $V_1$ across an external bootstrap capacitor $C_1$, having a capacitance on the order of 70 nf, which is too large to be produced in integrated circuit IC with reasonable cost of area. The other end of bootstrap capacitor $C_1$ is coupled to the supply voltage $V_{dd}$ via on-chip bootstrap diode emulator BDE, so that a charging current flows in C1 when the output terminal OUT is maintained substantially at ground potential during the time when lower transistor $T_1$ is in a conducting state, to bring $V_1$ to a voltage of $V_{dd}$ less any small voltage drops across BDE and $T_2$.

Figure 2:
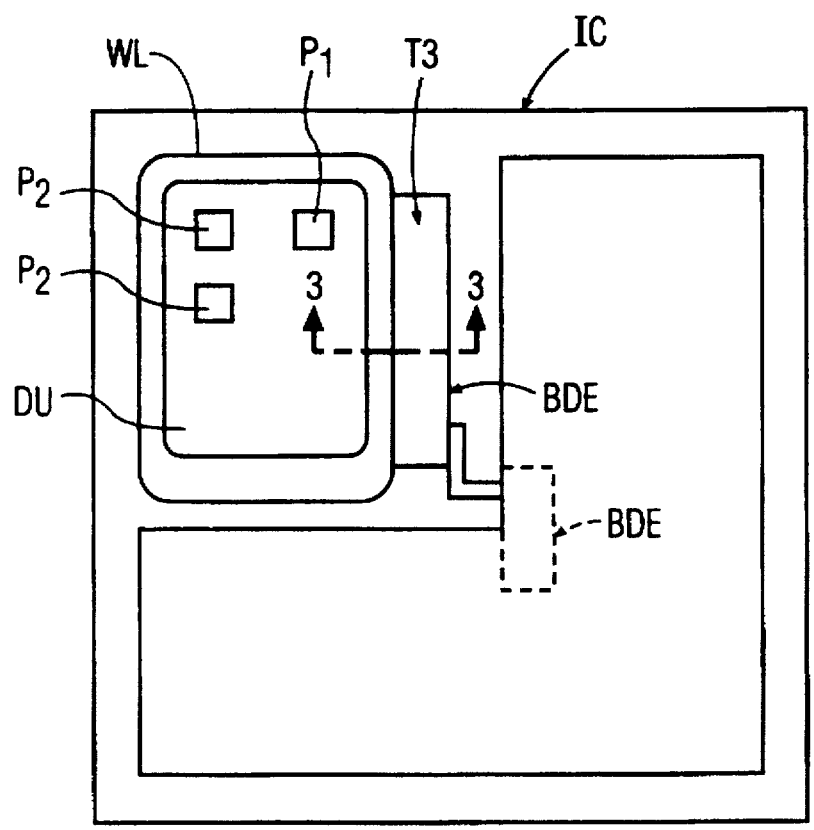
FIG. 2 is a schematic plan view of the integrated circuit chip corresponding to the dashed box IC in FIG. 1, including an elongated area in which a high voltage JFET T3 is formed.

Now referring also to FIG. 2, as is known, the upper drive module DU comprises CMOS circuitry formed in an insulated well WL, in integrated circuit chip IC, e.g. an N-well surrounded by P isolation. Thus, well WL is insulated from the balance of the integrated circuit by a structure similar to that used to produce a LDMOS transistor. A high voltage diode cannot be integrated in function isolation technologies because it results in large substrate currents. This could upset the operation of other circuitry. In accordance with the principles of the present invention, a bootstrap diode emulator provided on-chip comprises a JFET $T_3$ that is formed along the periphery of the well WL. JFET $T_3$ inherently has the same breakdown voltage as the well isolation (in excess of 500 Volts) and because current flows perpendicular to the well periphery, adequate current carrying capacity can be obtained by choice of the extent of the well periphery along which it is formed. Since an LDMOS structure is already used to form the floating well, and additional layers required to make up a JFET from the already existing LDMOS structure are not required, the bootstrap diode does not expend additional silicon area and yet adds an extra function on chip.

Figure 3:
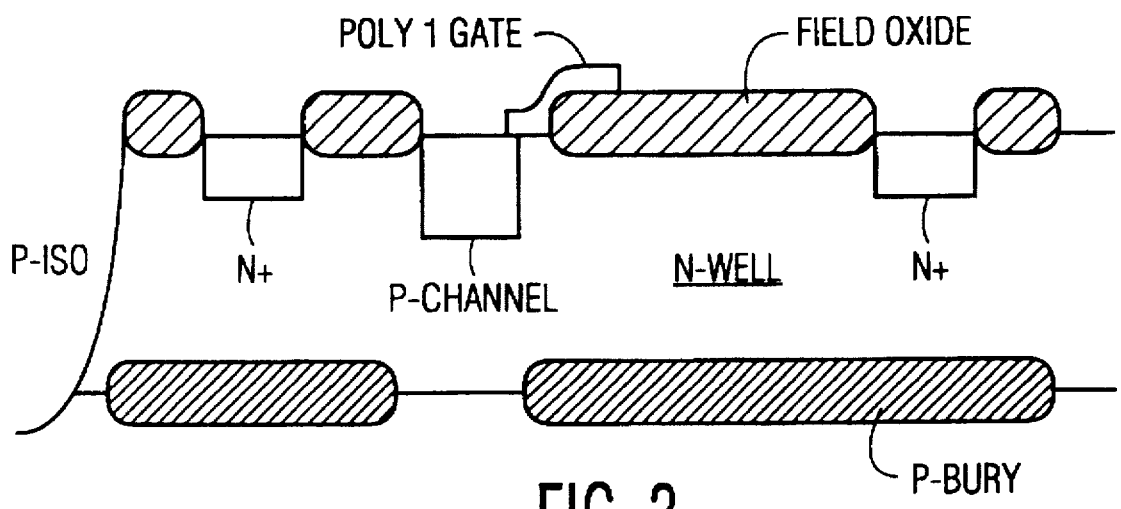
FIG. 3 is a cross-sectional view through the line 3—3 showing the structure of the JFET T3.

A cross-sectional view of the JFET is shown in FIG. 3. The n+ region near the P-Iso forms the source, the P-channel region the gate, and the n+ region on the right hand side forms the drain. The diffusion is in an N-Well with p-buried layer. The p-buried layer is interrupted to prevent premature pinch-off of the device. The high voltage capability is achieved by the lateral structure of the device.

The drive circuitry for JFET T3 is shown in the box BDE in FIG. 1. JFET T3 is operated in a source follower configuration with its drain connected to the bootstrap capacitor C1 and its source tied to one diode drop below Vdd via zener diode D4. This is done so that when the JFET T3 is turned on its drain rises up to Vdd minus a diode drop to provide a charging voltage to the bootstrap capacitor C1. The source of the JFET is a diode drop below Vdd since when JFET T3 is turned on, the source voltage of JFET T3 is allowed to float between Vdd−Vdiode to Vzener+Vdd. This is done as experimental results have shown that JFET T3 pinches off very cleanly at a higher source bias, and hence very little or no leakage current flows when it is off. JFET T3 is always operated in the third quadrant of its IV characteristics with the source voltage greater than the drain voltage and as a result the current $I_{DS}$ flows in the reverse direction from the source to the drain. In addition since the source and the drain are n-type and the gate is p-type, care should be taken to prevent the turn on of the parasitic diodes between gate source and Sate drain. This is accomplished by making sure that the gate of JFET T3 does not swing to Vdd, hence due to the action of series diodes D1, D2 and D3 the gate is allowed to swing only to Vdd minus three diode drops. Further the gate current is limited by resistor $R_L$ in series with these diodes.

Since JFET T3 is a depletion mode device, it is on with a gate to source voltage $V_{GS}$ of zero. During normal operation, JFET T3 can be turned off when the gate to source voltage $V_{GS}$ is —(Vdd−Vdiode). The gate drive circuitry has a level shifting inverter INV to level shift a signal from $IN_L$ used internally to 10–12 v followed by three buffer stages. The first stage is formed by transistors M1, M2. The second stage by transistors M3, M4, and the third stage by transistors M5, M6. The turn on of JFET T3 is coincident with the turn on of the lower power transistor $T_2$ of the half bridge.

During one phase of the clock, phi_1, the lower power device is on. During this phase the gate drive is applied to the gate of JFET T3 such that it is turned on charging the bootstrap capacitor C1. JFET T3 then turns off coincident with the turn off of the lower power transistor T2. At this instant the voltage from gate to source $V_{GS}$ is —(Vdd—Vdiode) hence the device is turned off.

Zero voltage switching mode of operation, which is typically used in the system, leads to certain special considerations in the design of the circuit. The two power transistors T1, T2 in the half-bridge are on during different phases of the clock with a dead time in between. Consider the half bridge circuit with a load LD as indicated in FIG. 1. During the latter part of a first phase, the current in the inductor is flowing into the ground. When the lower power transistor T2 is turned off at the end of the first phase, the current in the inductor, which cannot change instantaneously, flows in the parasitic body capacitor $C_{DS}$ (not shown) between drain and source of the upper and lower power transistors T1, T2. The floating node OUT rises from zero towards Vcc with a high dv/dt. The drain of JFET T3 which is connected to the bootstrap capacitor C1 also rises in the same manner. This high voltage capability of JFET T3 is achieved by the lateral distance between the drain and the source. After a time equal to the dead time, a second phase occurs in which the upper gate GU is turned on. During this second phase, the bootstrap capacitor C1 discharges through the floating well circuitry. The current in the inductive portion of the load LD eventually flows in the opposite direction. At the end of the second phase, the upper device is turned off but since the current in the inductor cannot change instantaneously, it is provided mainly by the capacitance $C_{DS}$ between drain and source of the lower and upper transistors T1, T2 which discharges totally pulling the floating node OUT to a diode drop below ground. After a time equal to the dead time, the lower power transistor is turned on and the cycle is repeated.

It should now be apparent that the objects of the present invention have been satisfied in all respects. Further, while the present invention has been described in particular detail, it should also be appreciated that its principles have broad general applicability. Consequently, numerous modifications are possible in the details given within the intended spirit and scope of the invention.

What is claimed is:

1. A circuit for driving a half-bridge formed by lower and upper power transistors connected between an output terminal and respective lower and upper rails of a high voltage DC supply, and for charging a bootstrap capacitor having first and second ends, the first end being connected to said output terminal, said circuit comprising:

means for generating lower and upper drive command signals for commanding driving said respective lower and upper power transistors to non-contemporaneous conducting states;

power supply means for generating at a power supply output a relatively low control voltage with respect to said lower rail;

a lower drive module connected to the power supply output for being powered by said relatively low control voltage and comprising means for applying a lower drive control signal between a control electrode of the lower power transistor and the lower rail in response to said lower drive command signal;

an upper drive module adapted to be connected to the first end of the bootstrap capacitor for being powered by a bootstrap voltage across said bootstrap capacitor and comprising means for applying an upper transistor control signal between a control electrode of the upper power transistor and the output terminal in response to said upper drive input control signal; and bootstrap diode emulator means for charging said bootstrap capacitor to said bootstrap voltage, said bootstrap diode emulator means comprising a JFET transistor having a source electrode coupled to said power supply output, a drain electrode adapted to be connected to the second end of the bootstrap capacitor, a gate electrode coupled to a further control signal derived from said lower drive command signal for driving said JFET transistor to a conducting state when the lower power transistor is driven to a conducting state.

2. A circuit as claimed in claim 1, wherein said source electrode is coupled to said power supply output via a diode, such that the voltage at said source electrode cannot rise above a level which is one diode drop below the voltage at said power supply output.

3. A circuit as claimed in claim 1, further comprising control circuitry for deriving said control signal in a manner that said control signal is constrained not to rise to a level which is a plurality of diode drops below the voltage at said power supply output.

4. A circuit as claimed in claim 3, wherein said plurality is three.

5. A circuit as claimed in claim 2, further comprising control circuitry for deriving said control signal in a manner that said control signal is constrained not to rise to a level which is a plurality of diode drops below the voltage at said power supply output.

6. A circuit as claimed in claim 5, wherein said plurality is three.

7. A circuit as claimed in claim 2, further comprising means for deriving said further control signal from said lower drive command signal, said means for deriving comprising a buffer fed by said lower drive command signal to produce a buffer output signal having a voltage range between said lower rail and said relatively low supply voltage, and means for translating the voltage range of said buffer output signal to a range of voltage difference between a point coupled to said gate electrode and said source electrode.

* * * * *